United States Patent [19]

Kobayashi

[11] Patent Number: 5,356,065

[45] Date of Patent: Oct. 18, 1994

[54] WIRE BONDING APPARATUS

[75] Inventor: Hiroaki Kobayashi, Yokohama, Japan

[73] Assignee: Kabushiki Kaisha Toshiba, Kawasaki, Japan

[21] Appl. No.: 899,138

[22] Filed: Jun. 15, 1992

Related U.S. Application Data

[63] Continuation of Ser. No. 567,609, Aug. 15, 1990.

[30] Foreign Application Priority Data

Aug. 18, 1989 [JP] Japan .................................. 1-212178

[51] Int. Cl.$^5$ .............................................. B23K 37/00
[52] U.S. Cl. .................. 228/4.5; 219/56.21; 228/105
[58] Field of Search .............. 228/105, 4.5, 9, 103, 228/8; 219/121.82, 56.21, 56.22

[56] References Cited

U.S. PATENT DOCUMENTS

| | | | |
|---|---|---|---|
| 3,643,321 | 2/1972 | Field et al. | 228/4.5 |
| 3,776,447 | 12/1973 | Adams et al. | 228/4.5 |
| 4,347,964 | 9/1982 | Takasugi et al. | 228/4.5 |
| 4,550,871 | 11/1985 | Chan et al. | 228/4.5 |
| 4,619,395 | 10/1986 | Amorosi et al. | 228/4.5 |
| 4,759,073 | 7/1988 | Shaw et al. | 228/103 |
| 4,826,069 | 5/1989 | Chan et al. | 228/103 |
| 4,919,335 | 4/1990 | Yoshida | 228/105 |

FOREIGN PATENT DOCUMENTS

0020345  1/1986  Japan ..................... 228/105

OTHER PUBLICATIONS

Patent Abstracts Of Japan, vol. 11, No. 346, published Nov. 12, 1987, and Japanese Patent No. 62-125639.

*Primary Examiner*—P. Austin Bradley
*Assistant Examiner*—James Miner
*Attorney, Agent, or Firm*—Foley & Lardner

[57] ABSTRACT

A wire bonding apparatus for semiconductor devices has a supporting block for holding a workpiece to which wires are bonded, a drive for driving the supporting block for holding the workpiece, the drive being capable of vertically moving and stopping the supporting block at a predetermined position, an optical means disposed above the supporting block and used for recognizing the pattern of the workpiece held on the supporting block, a storage means for prestoring each level of the workpiece so that the positions of not less than two places intended for recognition on the workpiece having difference in level conforms to the focal point of the optical means, and a control unit for controlling the drive for driving the supporting block, moving the workpiece to the position stored in the storage means and stopping the workpiece at that position. The supporting block is supported by a stroke bearing comprising a fixed part and a moving part which is moved and guided in the direction perpendicular to the fixed part. The drive for driving the supporting block comprises a cam shaft, a drive cam secured onto the cam shaft and generating a uniform velocity cam curve, a cam follower for coming contact with the drive cam, the cam follower being provided on the supporting block side, and a cam-driving pulse motor capable of rotating the cam shaft and electrically controlling the angle of rotation of the drive cam.

4 Claims, 3 Drawing Sheets

WIRE BONDING APPARATUS

This application is a continuation of application Ser. No. 07/567,609, filed Aug. 15, 1990.

BACKGROUND OF THE INVENTION

1. Field of the Invention

The present invention relates to wire bonding apparatus for semiconductor devices and more particularly to a wire bonding apparatus fit for use in manufacturing high-density semiconductor devices with accuracy.

2. Prior Art

Wire bonding apparatus and the like are increasingly desired to be precise in dealing with circuit patterns which tend to become miniaturized and densified and also with high-density packaging. It is now deemed essential for such wire bonding apparatus to correspond with the miniaturization of not only bonding pads but also bonding leads on semiconductor chips, for instance.

When leadframes, particularly thin leadframes of multi-pin LSI as intended workpieces, are handled, the well-known practice is to recognize patterns by means of an ITV camera for detecting what has been magnified through an optical lens barrel.

The wire bonding process stated above will be described with reference to FIG. 4.

While mounting a semiconductor chip 2 on the surface, a leadframe 1 as the workpiece having been taken out of a supply magazine (not shown), is conveyed up to a locking position for bonding with both its lateral end-undersurfaces supported by a pair of guide rails 3a, 3b.

A switching pulse motor 4, a flighted screw 5 with left and right portions threaded in opposite directions and the like are utilized for leveling and switching the pair of guide rails 3a, 3b, the guide rails 3a, 3b being contracted at the locking position to laterally position the leadframe by abutting against it.

A block 7 for supporting a workpiece such as a heater block which is made vertically freely moveable by a stroke bearing 6 is arranged under the locking position, whereas a presser member 9 for holding down the leadframe is arranged above the locking position, the presser member 9 being also made vertically freely moveable by a stroke bearing 8. The leadframe 1 is vertically sandwiched between the block 7 for supporting the workpiece and the presser member 9 and fixed at the locking position.

On the other hand, an optical lens barrel 11 for magnifying and guiding an image to a monitoring (CCD) camera 10 is disposed above the locking position of the leadframe 1. The monitoring camera 10 and the optical lens barrel 11 are secured to a bonding head 13 mounted on an X-Y table 12. A bonding arm 15, fitted with a bonding tool 14 at its leading end, is fitted to the bonding head 13 in such a way that it is capable of rocking.

The pattern enlarged through the optical lens barrel 11 is detected by the monitoring camera 10. Then the pattern on a combination of a bonding pad and an inner lead 1a of the leadframe 1 on the semiconductor chip 2 is recognized and the shifting of the bonding position is corrected, whereby wires 16 may be bonded by means of a bonding tool 14 accurately.

In a wire bonding apparatus of the sort stated above, however, the shifting of the optical focal point due to the difference in level between the surface of the semiconductor chip 2 and that of the inner lead 1a of the leadframe 1 may deteriorate the accuracy. As a result, it has generally been arranged that the optical lens barrel 11 is made vertically movable via a rolling bearing to prevent the focal point from shifting.

Moreover, there has been proposed a wire bonding apparatus for hybrid ICs in Japanese Patent Laid-Open No. 125639/1987. FIG. 5 shows the wire bonding apparatus disclosed therein.

A substrate fixing part 7' for holding a substrate 1 as an intended workpiece is made vertically movable via a motor 17 and a flighted screw 18 extended perpendicularly and rotated as the motor 17 rotates, so that the substrate 1 is vertically moved in conformity with the focal point of a monitoring camera 10.

In the case of the conventional wire bonding apparatus shown in FIG. 4, however, the problem is that the shifting of the optical focal point due to the difference in level between the surface of the semiconductor chip and that of the inner lead results in reduced accuracy. If the leadframe is to be vertically moved to solve the aforementioned problem, the block for supporting the workpiece together with the leadframe presser will have to be vertically moved. Even if the block for supporting the workpiece together with the leadframe presser is made vertically movable, the guide rails may rub against the edge faces of the leadframe, thus subjecting the inner lead of the leadframe and the bonded wire to oscillation, which may damage both of them and hence develop structural defects.

With the optical lens barrel arranged vertically movable, moreover, the provision of a mechanism for vertically moving the lens barrel will not only induce an increase in weight and cost but also create factors in reducing accuracy attributable to clearance and backlash in the slide portion of the optical lens barrel.

More specifically, owing to the general mechanical accuracy required to render the mechanism vertically movable, the problem of positional reproducibility of the vertical movement and that of the horizontal positional reproducibility derived from its vertical movement may sacrifice the accuracy. If it is attempted to vertically move the optical lens barrel by approximately 0.5 mm which is equivalent to the thickness of the semiconductor chip, for instance, the optical lens barrel may slightly rock as it vertically moves. Since the horizontal change resulting from the rocking motion is infinitesimal, it becomes hardly correctable.

In other words, a gap of several microns with the rolling bearing, for instance, constitutes an important factor in making inaccurate the bonding position at the stage where the accuracy of the bonding position of the order of microns is narrowed down.

In the case of the conventional wire bonding apparatus shown in FIG. 5, the substrate as the intended workpiece is vertically moved in conformity with the focal point of the optical system in order to adjust the substrate to the reference level of the bonding tool as bonding level after the pattern has been recognized. For this reason, the bonding thus effected is considered inclusive of errors ascribed to the vertical movement of the substrate.

Wire bonding by means of leadframes is not at a problematical level as long as the amount by which the perpendicularity of a bonding tool is affected because the difference in level resulting from the difference in the thickness of the leadframe, the level of a semiconductor chip and the like is within the range of approximately $\tan \Theta = 0.7 \text{ mm}/1.10 \text{ mm}$, $\Theta = 0.4°$. Consequently, if the perpendicularity of the bonding tool is within the above range of errors, the merit of taking the perpendicularity into consideration may be low; on the contrary, the demerit is considered rather high.

Since the flighted screw is employed for driving the substrate to move vertically, it is necessary to vertically move the leadframe presser for fastening the leadframe to the block for supporting the workpiece in addition to the member for fixing the substrate when, for instance, the leadframe is handled. As a result, two drives have to be installed around the member for fixing the substrate, causing an increase in installation space and cost.

SUMMARY OF THE INVENTION

An object of the present invention is to provide a wire bonding apparatus which is relatively simple and compact in construction and capable of controlling the vertical movement of a workpiece in conformity with the focal point of an optical system for recognizing a pattern horizontally moving at high speed without increasing the weight of the optical system, of materializing marked bonding accuracy by eliminating the cause of shifting in connection with the vertical movement of the workpiece, and of switching one to another kind of workpiece in a short time without causing damage to the workpiece.

In order to accomplish the foregoing object, the wire bonding apparatus for semiconductor devices according to the present invention comprises a supporting block for holding a workpiece conveyed by a conveyor, the supporting block being capable of vertical movement and of stopping at any given position; an optical means arranged above the workpiece and used for recognizing the pattern of the workpiece held by the supporting block; and a storage means for prestoring not less than two positions to be recognized of the workpiece, these positions conforming to the focal point of the optical means but differing in level, wherein after pattern recognition is made at one of the positions with respect to less than two recognizing levels on the same workpiece, the level of the workpiece is shifted to another where pattern recognition is effected at that position, whereby the required correction of the shifted position is implemented. It may also be made possible to arrange a drive cam operating with a uniform velocity curve in such a way that, by rotating the cam drive, the supporting block can be moved vertically and stopped at any position via a motor capable of electrically controlling the angle of rotation of the cam, and to recognize the pattern comparatively liberal in specification first among those different in level.

With the arrangement stated above, highly accurate wire bonding can be implemented according to the present invention through the steps of, for instance, moving the workpiece to adjust the focal point of the optical system to what is liberal in the specification required among not less than two levels to be recognized of the intended workpiece, recognizing the pattern at that position, moving the workpiece further to adjust the focal point of the optical system to another level to be recognized, recognizing the pattern at that position, and then correcting the shifting of wiring to be bonded by means of the pattern recognition.

As the present invention is thus arranged, highly accurate wire bonding can be accomplished by vertically moving the workpiece in conformity with the focal point of the optical system and besides eliminating the prime factor in the shifting relating to the vertical movement of the workpiece. Moreover, it is possible to not only switch one to another kind of workpiece in a short time but also deal with a workpiece mounting a semiconductor chip having difference in level.

In addition, the wire bonding apparatus provided according to the present invention can be made relatively simple and compact in construction without impairing high-speed wire bonding functions and increasing the weight of the optical system.

DESCRIPTION OF THE PREFERRED EMBODIMENTS

Figure 1:
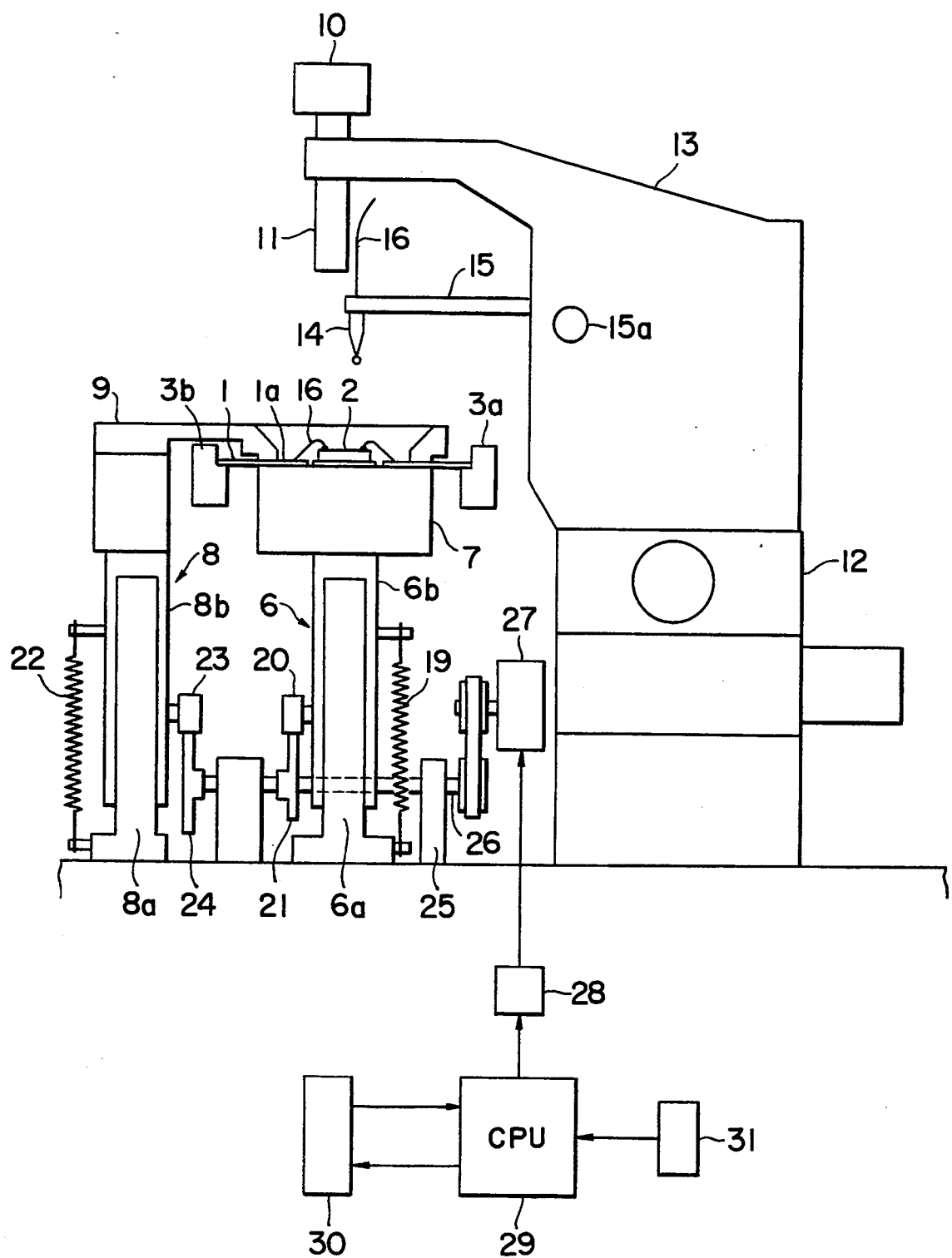
FIG. 1 is an elevational view illustrating a wire bonding apparatus embodying the present invention.
Figure 2:
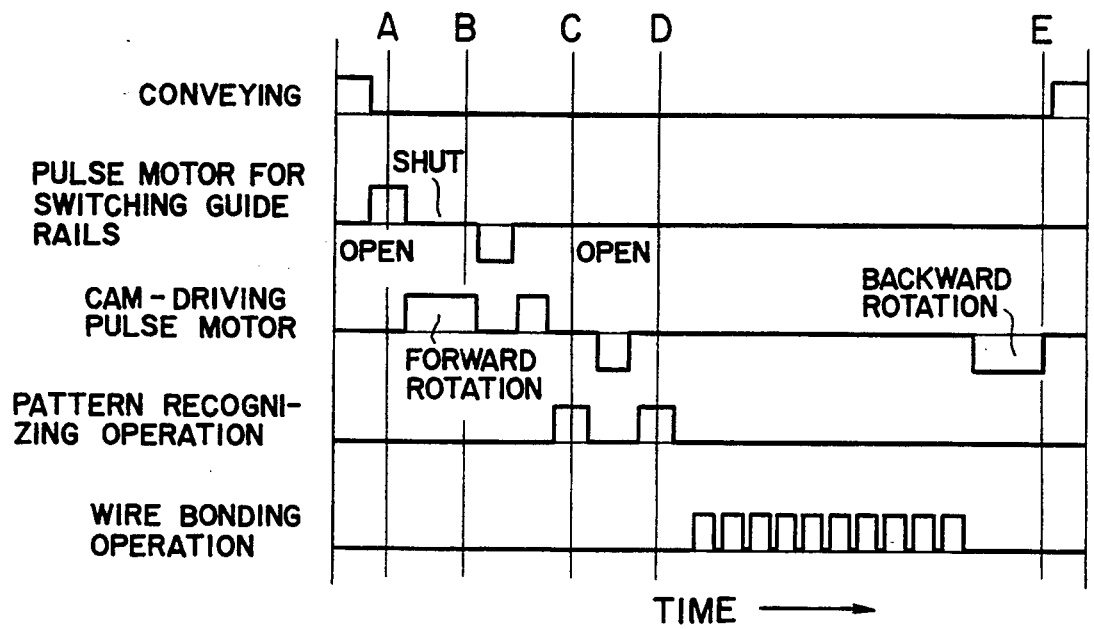
FIG. 2 is a timing chart illustrating the timing of conveyance, operations of guide rails, a switching pulse motor and a cam driving pulse motor, and pattern recognizing and wire bonding actions.

A description will subsequently given of an embodiment of the present invention with reference to FIGS. 1 to 3, inclusive.

While mounting a semiconductor chip 2 on the surface, a leadframe as the workpiece, having been taken out of a supply magazine (not shown), is conveyed up to a locking position for bonding with both its lateral end-undersurfaces supported by a pair of guide rails 3a, 3b.

Figure 4:
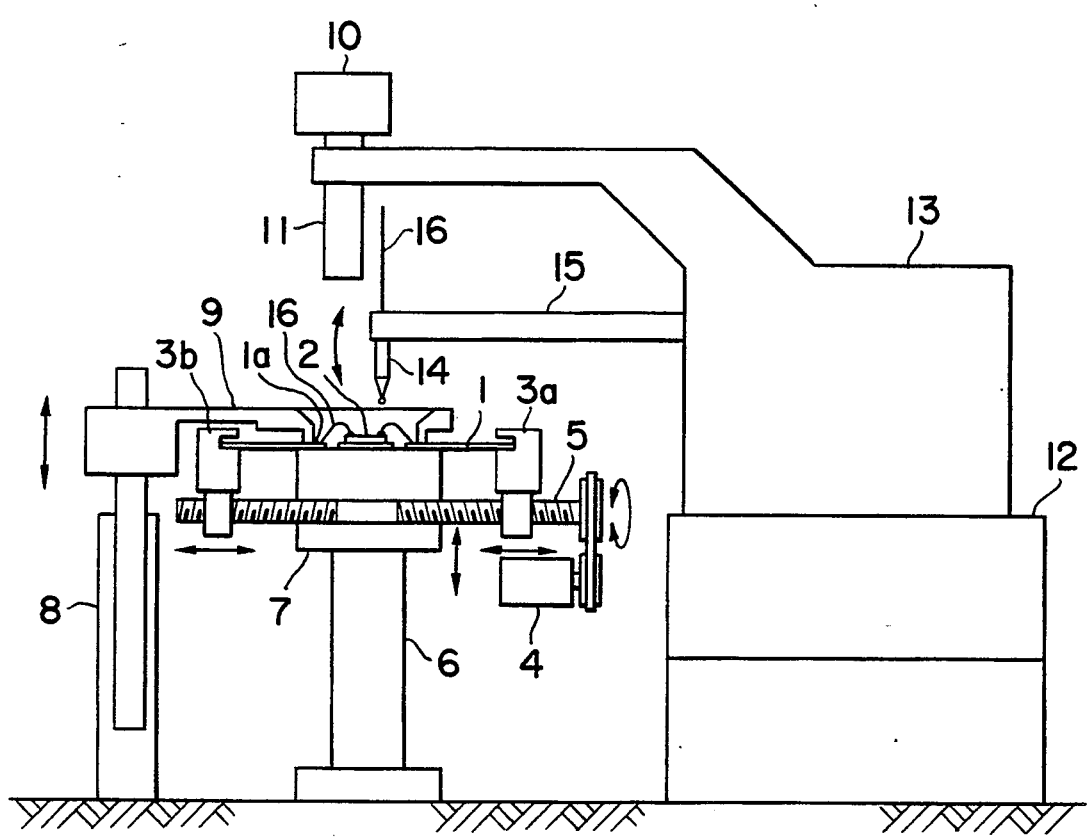
FIG. 4 is an elevational view illustrating a conventional wire bonding apparatus.
Figure 5:
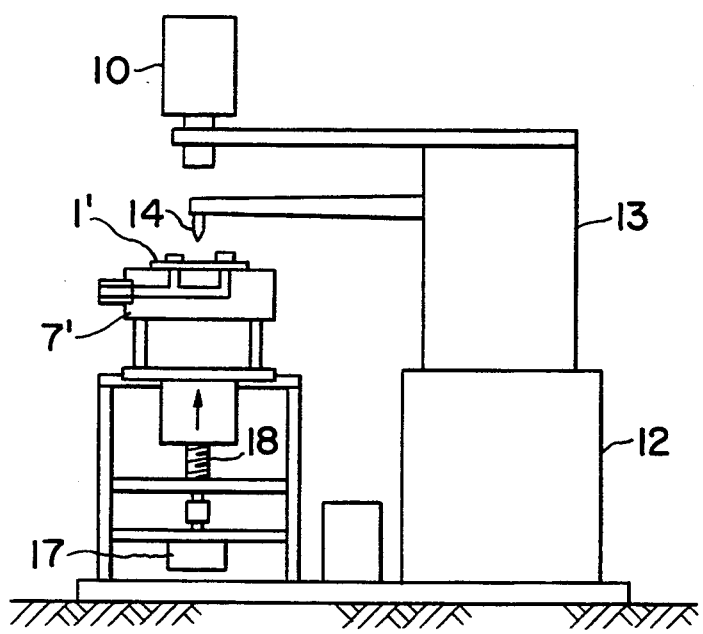
FIG. 5 is an elevational view illustrating another conventional wire bonding apparatus.

As in the case of the conventional wire bonding apparatus shown in FIG. 4, a switching pulse motor 4, a flighted screw 5 (not shown in FIG. 1) with left and right portions threaded in opposite directions and the like are utilized for leveling and switching the pair of guide rails 3a, 3b, the guide rails 3a, 3b being contracted at the locking position to laterally position the leadframe by abutting against it.

A supporting block 7 for holding the workpiece such as a heater block which is vertically freely moveable by a stroke bearing 6, is arranged under the locking position. A tension spring 19 is stretched between the fixed and the moving part 6a, 6b of the stroke bearing 6. With this tensile force, a cam follower 20, secured to the moving part 6b, is caused to abut against a cam 21 for vertically moving the block 7.

Moreover, a presser member 9 vertically freely moveable by a stroke bearing 8 is arranged above the locking position. A tension spring 22 is stretched likewise between the fixed and the moving part 8a, 8b of the stroke bearing 8. With this tensile force, a cam follower 23 secured to the moving part 8b is caused to abut against a cam 24 for vertically moving a leadframe presser.

These two cams 21, 24 are secured to the same cam shaft 26, rotatably supported by a bracket 25, and the cam shaft 26 is arranged so that it is rotated as a cam-driving pulse motor 27 rotates.

Figure 3:
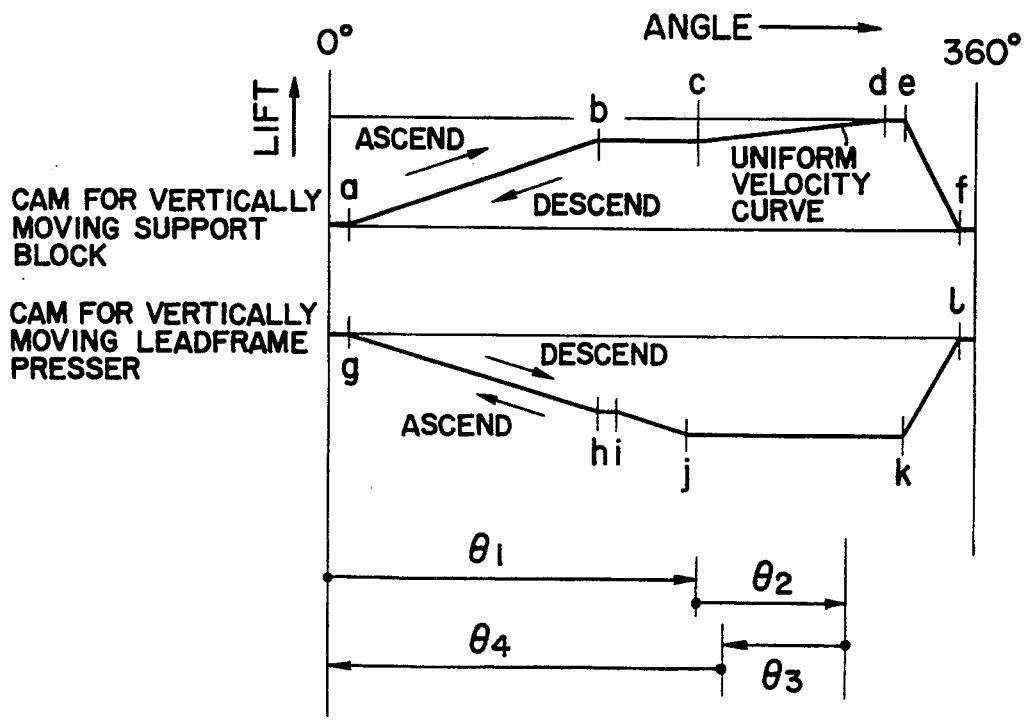
FIG. 3 is a graph illustrating curves drawn by a cam for vertically moving a supporting block and another for holding down a leadframe.

As shown in FIG. 3, the cam 21 for vertically moving the supporting block is so shaped as to cause the cam follower 20 to ascend in a sine curve within the range of angles of rotation a - b during the forward rotation, to stop within the range of angles of rotation b - c, to ascend in a uniform velocity curve within the range of angles of rotation c - d, to stop within the range of angles of rotation d - e, and to descend in a since curve within the range of angles of rotation e - f (this order is reversed during the backward rotation).

The cam 24 for vertically moving the supporting block is so shaped as to cause the cam follower 23 to descent within the range of angles of rotation g - h during the forward rotation, to stop within the range of angles of rotation h - i, to descend in a sine curve within the range of angles of rotation i - j, to stop within the range of angles of rotation j - k, and to ascend in a since curve within the range of angles of rotation k - 1 (this order is reversed during the backward rotation).

When the cam shaft 26 is rotated forward, the supporting block 7 thus ascends via the cam follower 20, whereas the leadframe presser 9 descends via the cam follower 23. When the leadframe 1 ascends by a predetermined amount, both its lateral end portions are vertically sandwiched and held between the supporting block 7 and the leadframe presser 9 and caused to ascend further. The cam 24 for vertically holding down the leadframe is detached from the cam follower 23 and the leadframe 1 is held by the elastic force of the tension spring 22 therebetween. While the leadframe 1 is thus held by the elastic force of the tension spring 22 therebetween, the supporting block 7 and hence the leadframe 1 are caused to ascend and descend along the uniform velocity curve of the cam 21 for vertically moving the supporting block.

By controlling the lifting amount of the leadframe 1 along the uniform velocity curve of the cam 21 for vertically moving the supporting block, i.e., the angle of rotation of the cam shaft 26, moreover, the leadframe 1 can be stopped in position. The angle of rotation of the cam-driving pulse motor 27 is controlled via a driver 28 according to an output signal from a CPU 29. The CPU 29 is fitted with a memory device 30, which is stored with stop positions of the leadframe 1 and the semiconductor chip 2 (i.e., a predetermined angle of rotation of the cam shaft 26 for vertically moving the supporting block), the stop positions conforming to the focal point of an optical lens barrel 11. The CPU 29 is also fitted with a condition input device 31.

The optical lens barrel 11 for enlarging and guiding an image to a monitoring (CCD) camera 10 is disposed at the position offset in the X-Y directions with respect to a bonding tool 14 above the locking position of the leadframe 1. The monitoring camera 10 and the optical lens barrel 11 are secured to a bonding head 13 mounted on an X-Y table 12 whose movement in the X-Y directions is controllable.

A bonding arm 15 fitted with the bonding tool 14 at its leading end is fitted to the bonding head 13 in such a way that it is capable of vertically rocking round a rocking fulcrum 15a, the bonding tool 14 having a bonding wire 16 passed therethrough.

The operating timing of the embodiment stated above will subsequently be described with reference to FIG. 2.

The leadframe 1 is first conveyed along the guide rails 3a, 3b and properly positioned in the direction of conveyance before being stopped. In this state, the pulse motor 4 for switching the guide rails is rotated forward by the predetermined amount that has been prestored (see FIG. 3) and the guide rails 3a, 3b are contracted, so that the leadframe 1 is laterally positioned (timing A).

Then the cam shaft 26 is rotated forward by the predetermined angle of rotation $\Theta_1$ shown in FIG. 3 via the cam-driving pulse motor 27 to ascend the supporting block 7 and simultaneously descend the leadframe presser 9. Both the lateral surface and undersurface of the leadframe 1 are held between the supporting block 7 and the leadframe presser 9 (timing B). The cam 24 for vertically moving the leadframe presser and the cam follower 23 are separated from each other, and the tensile force of the tension spring 22 is used to hold the leadframe 1 therebetween.

The pulse motor 4 for switching the guide rails is rotated backward to open the guide rails 3a, 3b in order to provide gaps between the guide rails 3a, 3b and the respective side edge faces of the leadframe 1.

While the guide rails 3a, 3b are kept open, the supporting block 7 and the leadframe 1 are made to ascend up to a position where the lead face of the inner lead 1a conforms to the focal point of the optical lens barrel 11.

More specifically, the cam-driving pulse motor 27 is rotated forward by the predetermined angle of rotation $\Theta_2$ shown in FIG. 3 via the cam shaft 26 to ascend the supporting block 7 via the cam follower 20 along the uniform velocity curve of the cam 21 for vertically moving the supporting block. The angle of rotation $\Theta_2$ is what has been prestored in the memory device 30 as the first stop position of the supporting block 7.

In this state, the pattern of the inner lead 1a of the leadframe 1 is recognized through image processing in the monitoring camera 10 (timing C).

Subsequently, the supporting block 7 and hence the leadframe 1 are caused to descend by the amount equivalent to the difference in level between the inner lead 1a and the semiconductor chip 2, i.e., up to the position where the focal point of the optical lens barrel 11 conforms to the bonding pad of the semiconductor chip 2. In other words, by rotating the cam shaft 26 backward by the predetermined angle of rotation $\Theta_3$ shown in FIG. 3 via the cam-driving pulse motor 27, the supporting block 7 is caused to descend via the cam follower 20 along the uniform velocity curve of the cam 21 for vertically moving the supporting block. The angle of rotation $\Theta_3$ is what has been prestored in the memory device 30 as the second stop position of the supporting block 7.

In this state, the pattern of the bonding pad of the semiconductor chip 2 is recognized through image processing in the monitoring camera 10 (timing D).

The shifting of the initially set coordinates of the leadframe 1 and the semiconductor chip 2 obtained from the pattern recognition stated above is utilized for correcting the respective positions of the wire bonding coordinates. While the supporting block 7 is stopped at the second stop position, wire bonding is effected by means of the bonding tool 14.

After the termination of the wire bonding operation, the cam shaft 26 is rotated backward by $\Theta_4$ shown in FIG. 3 via the cam-driving pulse motor 27 to return both the cams 21, 24 to the starting point. The supporting block 7 is consequently caused to descend through both the cam followers 20, 23, whereas the leadframe presser 9 is caused to ascend. The leadframe 1 is thus set free. Although the leadframe 1 is caused to descend while supported by the supporting block 7 at this time, it is detached from the supporting block 7 simultaneously with its arrival at the guide rails 3a, 3b, both the lateral end portions being supported by the guide rails 3a, 3b thereafter (timing E).

The leadframe 1 that has been subjected to wire bonding is then conveyed by the guide rails 3a, 3b and accommodated in a receiving magazine. A series of bonding operations is thus completed.

The present invention is needless to say not limited to the sequence and timing in the embodiment shown nor restricted by the elements such as pulse motors, a CCD camera and the like.

The reason for making the pattern recognition of the inner lead 1a followed by that of the semiconductor chip 2 is attributed to the fact that higher accuracy is required because the bonding pad of the semiconductor chip 2 is normally smaller than the inner lead 1a. In other words, the pattern of what is liberal in specification is first recognized to increase accuracy and therefore it is dependent on the bonding accuracy required which one of the patterns is to be recognized first.

Moreover, the level of the supporting block to be stopped is determined by the thickness of the leadframe 1 and the semiconductor chip 2, and the relative distance between the faces of the inner lead and the semiconductor chip.

With respect to a workpiece with a kind of leadframe different in level or a semiconductor chip different in thickness being mounted on the same leadframe, it can be dealt with by prestoring the level of the supporting block to be stopped in the form of numerical values and the like in the CPU for controlling the angle of rotation of the cam-driving pulse motor beforehand.

What is claimed is:

1. A wire bonding apparatus for semiconductor devices, said apparatus comprising:
   (A) a supporting block for supporting a workpiece to which wires are to be bonded;
   (B) first guide means for guiding and supporting said supporting block in a direction perpendicular to a base floor;
   (C) a presser member, located above said supporting block, for holding down said workpiece on said supporting block;
   (D) second guide means for guiding and supporting said presser member in a direction perpendicular to said base floor;
   (E) first drive cam means for driving said supporting block;
   (F) second drive cam means for driving said presser member; and
   (G) a common driving cam shaft which is connected to each of said first and second drive cam means and which drives said first and second drive cam means.

2. The wire bonding apparatus as claimed in claim 1, wherein each of said first and second guide means comprises a stroke bearing including a fixed part and a moving part, said moving part being moved an guided in a direction perpendicular to said fixed part.

3. The wire bonding apparatus as claimed in claim 1, wherein each of said first and second drive cam means includes a drive cam secured to said driving cam shaft and generating a uniform velocity cam curve, and a cam follower which contacts said drive cam, said apparatus further comprising an electrical cam-driving pulse motor which rotates said cam shaft and which controls the angle of rotation of said drive cams.

4. A method comprising:
   (A) supporting on a supporting block a workpiece to which wires are to be bonded;
   (B) guiding and supporting said supporting block in a direction perpendicular to a base floor via a first guide device;
   (C) holding down said workpiece on said supporting block via a presser member located above said supporting block;
   (D) guiding and supporting said presser member in a direction perpendicular to said base floor via a second guide device;
   (E) driving said supporting block via a first drive cam;
   (F) driving said presser member via a second drive cam; and
   (G) driving said first and second drive cams via a common driving cam shaft which is connected to each of said first and second drive cams.

* * * * *